United States Patent [19]

Hosoi et al.

[11] Patent Number: 4,851,677
[45] Date of Patent: Jul. 25, 1989

[54] APPARATUS FOR RECORDING AND REPRODUCING IMAGE PRODUCED BY AN ELECTRON MICROSCOPE INCLUDING AN OPTICAL FILTER AND A DEFLECTING ELEMENT

[75] Inventors: Yuichi Hosoi; Kenji Takahashi; Nobufumi Mori; Masaru Noguchi, all of Kanagawa, Japan

[73] Assignee: Fuji Photo Co., Ltd., Kanagawa, Japan

[21] Appl. No.: 804,775

[22] Filed: Dec. 5, 1985

[30] Foreign Application Priority Data

| Dec. 7, 1984 [JP] | Japan | 59-258783 |
| Apr. 17, 1985 [JP] | Japan | 60-81799 |
| Apr. 17, 1985 [JP] | Japan | 60-81800 |
| Apr. 17, 1985 [JP] | Japan | 60-81801 |

[51] Int. Cl.⁴ ............................................. H01J 37/22
[52] U.S. Cl. .................................... 250/327.2; 250/397
[58] Field of Search ................. 250/327.2, 337, 484.1, 250/397

[56] References Cited

U.S. PATENT DOCUMENTS

| 3,823,322 | 7/1974 | Willasch et al. | 250/311 |
| 3,859,527 | 1/1975 | Luckey | 250/327.2 |
| 3,883,748 | 5/1975 | Nada et al. | 250/484.1 |
| 3,975,637 | 8/1976 | Ikedo et al. | 250/327.2 |
| 4,236,078 | 11/1980 | Kotera et al. | 250/363 R |
| 4,239,968 | 12/1980 | Kotera | 250/327.2 |
| 4,258,264 | 3/1981 | Kotera et al. | 250/484.1 |
| 4,276,473 | 6/1981 | Kato et al. | 250/327.2 |
| 4,315,318 | 2/1982 | Kato et al. | 364/515 |
| 4,336,154 | 6/1982 | Nishimura et al. | 252/301.4 H |
| 4,387,428 | 6/1983 | Ishida et al | 364/414 |
| 4,394,581 | 7/1983 | Takahashi et al. | 250/484.1 |
| 4,400,619 | 8/1983 | Kotera et al. | 250/327.2 |
| 4,505,989 | 3/1985 | Umemoto et al. | 428/691 |
| 4,543,480 | 9/1985 | Kato | 250/327.2 |

Primary Examiner—Janice A. Howell
Assistant Examiner—Constantine Hannaher
Attorney, Agent, or Firm—Gerald J. Ferguson, Jr.

[57] ABSTRACT

An apparatus for recording and reproducing an image of a specimen produced by an electron microscope includes a two-dimensional image sensor for storing the energy of an electron beam having passed through the specimen, a stimulating system for scanning the two-dimensional image sensor with stimulating energy to discharge the stored electron beam energy as light from the two-dimensional image sensor, a photoelectric transducer for photoelectrically detecting the light discharged from the two-dimensional image sensor, and an erasing system for applying erasing energy to the two-dimensional image sensor to discharge energy remaining thereon after the light has been photoelectrically detected. The apparatus further includes an optical filter for cutting off light which has a wavelength in the wavelength region of the stimulating energy. The stimulating system includes a deflecting element for deflecting the stimulating energy towards the two-dimensional sensor.

5 Claims, 9 Drawing Sheets

APPARATUS FOR RECORDING AND REPRODUCING IMAGE PRODUCED BY AN ELECTRON MICROSCOPE INCLUDING AN OPTICAL FILTER AND A DEFLECTING ELEMENT

BACKGROUND OF THE INVENTION

1. Field of the Invention

The present invention relates to an apparatus for recording and reproducing images produced by an electron microscope, and more particularly to an apparatus for recording electron microscope images with high sensitivity and for reproducing the recorded electron microscope images in the form of electric signals in order to allow the images to be processed in various ways.

2. Description of the Prior Art

There are known electron microscopes for obtaining a magnified image of a specimen by deflecting a beam of electrons transmitted through the specimen with an electric or magnetic field. As is well known, the electron beam having passed through the specimen forms a diffraction pattern on the rear focal plane of the objective lens, and the diffracted beams interfere with each other again to produce the magnified image of the specimen. The magnified specimen image can be observed as a transmission image by projecting the image onto a screen with a projector lens. Alternatively, the rear focal plane of the objective lens may be projected for enabling the user to observe the magnified diffraction pattern of the image. Where an intermediate lens is positioned between the objective lens and the projector lens, the magnified transmission image or the diffraction pattern may be produced selectively as desired by adjusting the focal length of the intermediate lens.

For observing the magnified image or the diffraction pattern (hereinafter referred to collectively as a transmitted electron-beam image), it has been the general practice to place a photographic film on the image formation plane of the projector lens for exposure to the transmitted electron-beam image. According to another design, an image intensifier is employed to amplify the transmitted electron-beam image for projection. The use of photographic films is however disadvantageous in that their sensitivity to electron beams is low and the process of developing the films is complex. The image intensifier also has drawbacks in that the images produced thereby have poor sharpness and are likely to become distorted.

Transmitted electron-beam images are often processed to make them easier to see. Specifically, the transmitted electron-beam images are subjected to various signal processing modes such as tone processing, frequency emphasis, density processing, subtractive processing, and additive processing. The images are also processed to reconstruct three-dimensional images by Fourier analysis, digitize the images, and measure particle diameters. The diffraction patterns are also processed to analyze crystal information and find lattice constants, dislocations, and lattice defects. For such image and diffraction pattern processing, it has been customary to convert the electron microscope image on a developed photographic film into an electric signal with a microphotometer, convert the electric signal into a digital signal, and then process the digital signal with a computer. This process has proven unsatisfactory since it is quite complex.

SUMMARY OF THE INVENTION

In view of the aforesaid problems of the prior electron microscope image recording devices, it is an object of the present invention to provide an apparatus for recording and reproducing electron microscope images with high sensitivity and quality and in a manner enabling direct production of electric signals representing the images so that the images can be processed in various ways.

The present invention provides an apparatus for recording and reproducing an image of a specimen produced by an electron microscope, comprising a two-dimensional image sensor for storing the energy of an electron beam having passed through the specimen, stimulating means for scanning the two-dimensional image sensor with stimulating energy to discharge the stored electron beam energy as light from the two-dimensional image sensor, a photoelectric transducer for photoelectrically detecting the light discharged from the two-dimensional image sensor, and erasing means for applying erasing energy to the two-dimensional image sensor to discharge energy remaining thereon after the light has been photoelectrically detected.

The stimulating means includes a deflecting element for deflecting the stimulating energy toward the two-dimensional image sensor. The deflecting element may be movable between a first position in which it substantially faces the center of the two-dimensional image sensor to direct the stimulating energy toward the two-dimensional image sensor and a second position in which it is retracted out of the path of the electron beam toward the two-dimensional image sensor.

The two-dimensional image sensor may be movable between a recording position in which it lies substantially perpendicularly to the path or axis of the electron beam and a read-out position in which it lies obliquely to the path of the electron beam.

The deflecting element of the stimulating means may be located in a position in which it substantially faces the center of the two-dimensional image sensor and is out of the path of the electron beam.

The two-dimensional image sensor may be fixed in the image formation plane of the electron microscope which lies perpendicularly to the axis of the electron beam, or may be fixed obliquely to the axis of the electron beam. Where the two-dimensional image sensor lies obliquely to the axis of the electron beam, the apparatus also includes a signal processor for converting the image recorded on the two-dimensional image sensor into an image on the image formation plane normal to the electron beam axis.

Upon exposure to the electron beam, the two-dimensional image sensor can temporarily store at least part of the electron beam energy. When the stimulating energy is subsequently applied to the two-dimensional image sensor which stores the electron beam energy, the two-dimensional image sensor can discharge at least part of the stored energy in a detectable form such as light, electricity, or sound.

The two-dimensional image sensor preferably comprises a stimulable phosphor sheet as disclosed in Japanese Unexamined Patent Publication No. 56(1981)-11395 and U.S. Pat. Nos. 4,258,264, 4,276,473, 4,315,318 and 4,387,428, for example. Certain phosphors, when exposed to a radiation such as an electron beam, store a part of the energy of the radiation. When the phosphor exposed to the radiation is exposed to stimulating rays such as visible light, the phosphor emits light (stimulated emission) in proportion to the stored energy of the radiation. Such a phosphor is called a stimulable phosphor, and the stimulable phosphor sheet is generally composed of a support and a stimulable phosphor layer disposed on the support. The stimulable phosphor layer may be formed by dispersing the stimulable phosphor in a suitable binder. However, the stimulable phosphor layer may itself be a stimulable phosphor sheet if it is self-supporting. Examples of stimulable phosphors which the stimulable phosphor sheet can be made of are described in Japanese Patent Application No. 56(1984)-214680 (U.S. patent application No. 786,080).

The two-dimensional sensor may also be in the form of a thermoluminescent phosphor sheet as disclosed in Japanese Patent Publication Nos. 55(1980)-47719 and 55(1980)-47720, for example. The thermoluminescent phosphor sheet emits stored radiation energy as thermoluminescent when heat is applied to the sheet. The thermoluminescent phosphor sheet may be constructed in the same manner as the stimulable phosphor sheet.

The stimulating means may comprise X - Y deflecting means comprising a stimulating light source such as an He - Ne laser or a semiconductor laser or a heat source such as a $CO_2$ laser, and X and Y deflecting members such as galvanometer mirrors, rotatable polygonal mirrors, hologram scanners, and acoustooptic deflectors.

The two-dimensional sensor is placed in the image formation plane of the electron microscope, and the electron microscope image is recorded on the two-dimensional sensor by the electron beam transmitted through the specimen. Then, the two-dimensional sensor on which the electron microscope image is stored is scanned in X and Y directions, i.e. two-dimensionally, by stimulating rays such as visible light or heat to enable the image sensor to emit the stored electron beam energy as light. The emitted light is then photoelectrically read by the photoelectric transducer such as a photomultiplier or CCD (charge-coupled device) which produces an electric signal indicative of the transmitted electron-beam image. The photoelectric transducer is positioned in close contact with or near the two-dimensional image sensor remotely from the side thereof which was scanned by the stimulating rays. An optical filter for cutting off light having the wavelength of the stimulating rays or infrared radiation and a light shutter which opens when the emitted light is read by the photoelectric transducer, are interposed between the photoelectric transducer and the two-dimensional image sensor. It is preferable for a support for the two-dimensional image sensor to have the function of the optical filter. The electric image signal thus generated may be employed to display the electron microscope image on a display unit such as a CRT, or to record the electron microscope image permanently as a hard copy, or to store the electron microscope image temporarily on a recording medium such as a magnetic tape, a magnetic disk, an optical disc, a photomagnetic disc, or the like.

The electron microscope images can be recorded with high sensitivity using the two-dimensional image sensor of the type described above. Damage to the specimen can be reduced since the amount of the electron beam to which the specimen is exposed can be reduced. The electric image signals produced from the two-dimensional image sensor can easily be processed in various modes, such as tone processing and frequency emphasis, for example. The processing of diffraction patterns, and image analyses such as the reconstruction of three-dimensional images and image digitization can simply and quickly be performed by applying the electric signal to a computer.

The two-dimensional image sensor remains positioned in a vacuum system connected to the electron microscope. Therefore, it is not necessary to inactivate the vacuum system each time the recorded image on the two-dimensional image sensor is to be read out. Since the two-dimensional image sensor is two-dimensionally scanned by the stimulating means, the apparatus requires no means for moving the two-dimensional image sensor in a subscanning direction, and hence can be small in size. The photoelectric transducer is positioned in close contact with or near the two-dimensional image sensor remotely from its scanned side, with the optical filter and the light shutter being interposed between the photoelectric transducer and the two-dimensional image sensor, so that the angle through which the light emitted by the image sensor is detected by the photoelectric transducer is large, assuring a high S/N ratio.

The deflecting element of the stimulating means may comprise the X or Y deflecting member such as galvanometer mirrors, or another deflecting member such as a reflecting mirror for reflecting a light or heat beam from the X - Y deflecting means toward the two-dimensional image sensor.

Since the light beam or heat is directed toward the two-dimensional image sensor by the deflecting element located in a position which is substantially opposite the center of the two-dimensional image sensor, the diameter of the scanning spot of the light or heat beam and the length of the beam do not vary widely between the center and ends of the image sensor. Therefore, the diameter of the scanning light or heat beam spot can be made sufficiently uniform by an ordinary two-dimensional $f\theta$ lens, with the result that the electron microscope image recorded on the two-dimensional image sensor can be read out highly accurately by the scanning beam spot.

In the event the two-dimensional image sensor is positioned obliquely to the axis of the electron beam applied thereto, the electron beam image recorded on the image sensor is distorted. However, the electric signal produced by the photoelectric transducer is processed by the signal processor into a proper electron microscope image on the image formation plane normal to the electron beam axis.

The stimulable phosphor employed in the stimulable phosphor sheet according to the present invention may comprise phosphors expressed by the composition formulas: SrS:Ce, Sm; SrS:Eu, Sm; $ThO_2$:Er; and $La_2O_2S$:Eu, Sm, as disclosed in U.S. Pat. No. 3,859,527.

The stimulable phosphor may also comprise phosphors expressed by the composition formulas: ZnS:Cu,Pb; $BaO.xAl_2O_3$:Eu [where $0.8 \leq x \leq 10$]; and $M^{II}O.xSiO_2$:A [where $M^{II}$ is Mg, Ca, Sr, Zn, Cd, or Ba; A is Ce, Tb, Eu, Tm, Pb, Tl, Bi, or Mn; and $0.5 \leq x \leq 2.5$], as disclosed in U.S. Pat. No. 4,236,078.

The stimulable phosphor may also comprise phosphors expressed by the composition formula: $(Ba_{1-x-y}Mg_x Ca_y)FX$:a$Eu^{2+}$ [where X is at least one of Cl and Br; $0 < x+y \leq 0.6$, $xy \neq 0$, and $10^{-6} < a < 5 \times 10^{-2}$[, as disclosed in Japanese Unexamined Patent Publication No. 55(1980)-12143.

The stimulable phosphor may also comprise phosphors expressed by the composition formula: LnOX:xA [where Ln is at least one of La, Y, Gd, and Lu; X is at least one of Cl and Br; A is at least one of Ce and Tb; and $0 < x < 0.1$], as disclosed in U.S. Pat. No. 4,236,078.

The stimulable phosphor may also comprise phosphors expressed by the composition formula: $(Ba_{1-x}, M^{II}_x)FX:yA$ [where $M^{II}$ is at least one of Mg, Ca, Sr, Zn, and Cd, X is at least one of Cl, Br, and I; A is at least one of Eu, Tb, Ce, Tm, Dy, Pr, Ho, Nd, Yb, and Er; $0 \leq x \leq 0.6$, and $0 \leq y \leq 0.2$], as disclosed in U.S. Pat. No. 4,239,968.

The stimulable phosphor may also comprise phosphors expressed by the composition formula: $M^{II}FX \cdot xA:yLn$ [where $M^{II}$ is at least one of Ba, Ca, Sr, Mg, Zn, and Cd; A is at least one of BeO, MgO, CaO, SrO, BaO, ZnO, $Al_2O_3$, $Y_2O_3$, $La_2O_3$, $In_2O_3$, $SiO_2$, $TlO_2$, $ZrO_2$, $GeO_2$, $SnO_2$, $Nb_2O_5$, $Ta_2O_5$, and $ThO_2$; Ln is at least one of Eu, Tb, Ce, Tm, Dy, Pr, Ho, Nd, Yb, Er, Sm, and Gd; X is at least one of Cl, Br, and I; $5 \times 10^{-5} < x < 0.5$, and $0 < y < 0.2$], as disclosed in Japanese Unexamined Patent Publication No. 55(1980)-160078 (U.S. patent application No. 591,224).

The stimulable phosphor may also comprise phosphors expressed by the composition formula: $(Ba_{1-x} M^{II}_x)F_2 \cdot aBaX_2:yEu^{2+}$, zA [where $M^{II}$ is at least one of beryllium, magnesium, calcium, strontium, zinc and cadmium; X is at least one of chlorine, bromine, and iodine; A is at least one of zirconium and scandium; $0.5 \leq a \leq 1.25$, $0 \leq x \leq 1$, $10^{-6} \leq y \leq 2 \times 10^{-1}$, and $0 < z \leq 10^{-2}$], as disclosed in Japanese Unexamined Patent Publication No. 56(1981)-116777.

The stimulable phosphor may also comprise phosphors expressed by the composition formula: $(Ba_{1-x} M^{II}_x)F_2 \cdot aBaX_2:yEu^{2+}$, zB [where $M^{II}$ is at least one of beryllium, magnesium, calcium, strontium, zinc, and cadmium; X is at least one of chlorine, bromine and iodine; $0.5 \leq a \leq 1.25$, $o \leq x \leq 1$, $10^{-6} \leq y \leq 2 \times 10^{-1}$, and $0 < z \leq 10^{-1}$], as disclosed in U.S. Pat. No. 4,336,154.

The stimulable phosphor may also comprise phosphors expressed by the composition formula: $(Ba_{1-x} M^{II}_x)F_2 \cdot aBaX_2:yEu^{2+}$, zA [where $M^{II}$ is at least one of beryllium, magnesium, calcium, strontium, zinc, and cadmium; X is at least one of chlorine, bromine, and iodine; A is at least one of arsenic and silicon; $0.5 \leq a \leq 1.25$, $0 \leq x \leq 1$, $10^{-6} \leq y \leq 2 \times 10^{-1}$, and $0 < z \leq 5 \times 10^{-1}$], as disclosed in Japanese Unexamined Patent Publication No. 57(1982)-23675.

The stimulable phosphor may also comprise phosphors expressed by the composition formula: $(Ba_{1-x} M_{x/2} L_{x/2}) FX:yEu^{2+}$ [where M is at least one alkaline metal selected from the group consisting of Li, Na, K, Rb, and Cs; L is at least one trihydric metal selected from the group consisting of Sc, Y, La, Ce, Pr, Nd, Pm, Sm, Gd, Tb, Dy, Ho, Er, Tm, Yb, Lu, Al, Ga, In, and Tl; X is at least one halogen selected from the group consisting of C, Br, and I; $10^{-2} \leq x \leq 0.5$, and $0 < y \leq 0.1$], as disclosed in Japanese Unexamined Patent Publication No. 58(1983)-206678 (U.S. patent application No. 741,020).

The stimulable phosphor may also comprise phosphors expressed by the composition formula: BaFX $\cdot$ xA:yEu$^{2+}$ [where X is at least one halogen selected from the group consisting of Cl, Br, and I; A is a calcined tetrafluoroboric compound; $10^{-6} \leq x \leq 0.1$, and $0 < y \leq 0.1$], as disclosed in Japanese Unexamined Patent Publication No. 59(1984)-27980.

The stimulable phosphor may also comprise phosphors expressed by the composition formula: BaFX $\cdot$ xA:yEu$^{2+}$ [where X is at least one halogen selected from the group consisting of Cl, Br, and I; A is at least one calcined compound selected from the group consisting of the salts of monohydric or dihydric metals of hexafluorosilicic acid, hexafluorotitanic acid, and hexafluorozirconic acid; $10^{-6} \leq x \leq 0.1$, and $0 < y \leq 0.1$], as disclosed in Japanese Unexamined Patent Publication No. 59(1984)-47289.

The stimulable phosphor may also comprise phosphors expressed by the composition formula: BaFX $\cdot$ xNaX':aEu$^{2+}$ [where each of X and X' is at least one of Cl, Br, and I; $0 < x \leq 2$, and $0 < a \leq 0.2$], as disclosed in Japanese Unexamined Patent Publication No. 59(1984)-56479.

The stimulable phosphor may also comprise phosphors expressed by the composition formula: $M^{II}FX \cdot xNaX':yEu^{2+}$, zA [where $M^{II}$ is at least one alkaline earth metal selected from the group consisting of Ba, Sr, and Ca; each of X and X' is at least one halogen selected from the group consisting of Cl, Br, and I; A is at least one transition metal selected from the group consisting of V, Cr, Mn, Fe, Co, and Ni; $0 < x \leq 2$, $0 > y \leq 0.2$, and $0 > z \leq 10^{-2}$], as disclosed in U.S. Pat. No. 4,505,989.

The stimulable phosphor may also comprise phosphors expressed by the composition formula: $M^{II}FX \cdot aM^{I}X' \cdot bM^{II'}X''_2 \cdot cm^{III}X'''_3 \cdot xA:yEu^{2+}$ [where $M^{II}$ is at least one alkaline earth metal selected from the group consisting of Ba, Sr, and Ca; $M^I$ is at least one alkaline metal selected from the group consisting of Li, Na, K, Rb, and Cs; $M'^{II}$ at least one dihydric metal selected from the group consisting of Be and Mg; $M^{II}$ is at least one trihydric metal selected from the group consisting of Al, Ga, In, and Tl; A is a metal oxide; X is at least one halogen selected from the group consisting of Cl, Br, and I; X', X''and X''' are at least one halogen selected from the group consisting of F, Cl, Br, and I; $0 \leq a \leq 2$, $0 \leq b \leq 10^{-2}$, $0 \leq c \leq 10^{-2}$, and $a+b+c \geq 10^{-6}$; $0 < x \leq 0.5$ and $0 < y \leq 0.2$], as disclosed in Japanese Unexamined Patent Publication No. 59(1984)-75200 filed by the present applicant.

The stimulable phosphor may also comprise phosphors expressed by the composition formula: $M^{II}X_2 \cdot aM^{II}X'_2:xEu^{2+}$ [where $M^{II}$ is at least one alkaline earth metal selected from the group consisting of Ba, Sr, and Ca; X and X' are at least one halogen selected from the group consisting of Cl, Br, and I with $X \neq X'$; $0.1 \leq a \leq 10.0$ and $0 < x \leq 0.1$], as disclosed in Japanese Patent Application No. 58(1983)-193161 (U.S. patent application No. 834,886).

The stimulable phosphor which can be employed in the present invention is however not limited to the aforesaid phosphors, but may be any phosphor capable of stimulated emission upon exposure to stimulating light after it has been irradiated with a radiation such as an electron beam.

Preferred thermoluminescent phosphors that can be used in the present invention include compounds produced by adding a small amount of at least one of Mn, Dy, and Tm to sulphuric compounds such as $Na_2SO_4$, $MnSO_4$, $CaSO_4$, $SrSO_4$, and $BaSO_4$.

The phosphor sheet may additionally have a protective layer which may be electrically conductive for preventing the phosphor sheet from being charged up by the electron beam applied thereto. The phosphor layer of the phosphor sheet may be colored with a pigment or a dye as disclosed in U.S. Pat. No. 4,394,581.

The above and other objects, features and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Figure 1:
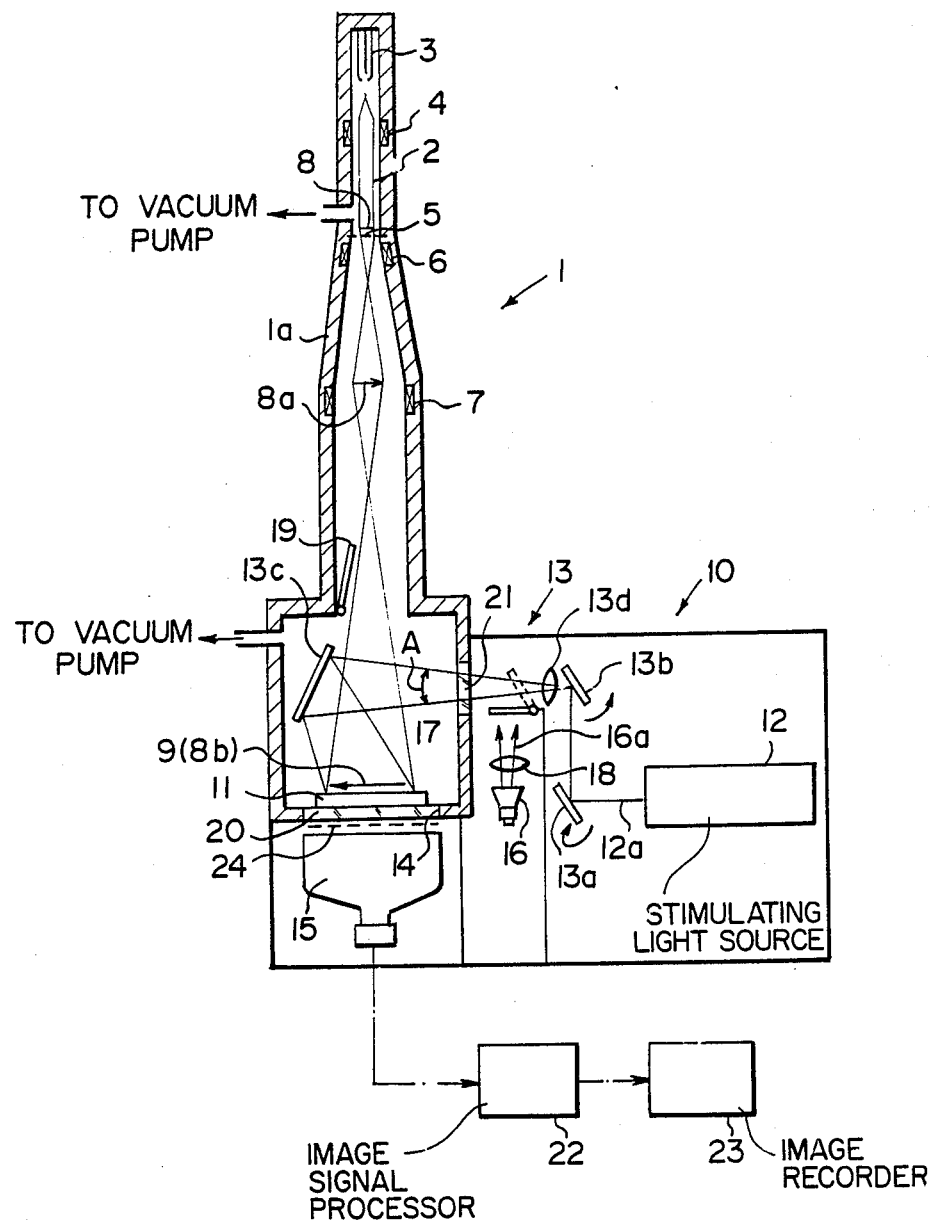
FIG. 1 is a vertical cross-sectional view of an apparatus for recording and reproducing images produced by an electron microscope according to an embodiment of the present invention.

Like or corresponding parts are denoted by like or corresponding reference characters throughout several views.

FIG. 1 shows an apparatus for recording and reproducing electron microscope images according to an embodiment of the present invention. An electron microscope 1 has a tubular lens barrel 1a housing an electron gun 3 for emitting an electron beam 2 at a uniform speed, at least one convergent lens 4 comprising a magnetic lens or an electrostatic lens for converging the electron beam 2 toward a specimen 8, a specimen support 5, an objective lens 6 identical to the convergent lens 4, and a projector lens 7. The electron beam 2 having passed through the specimen 8 placed on the specimen support 5 is deflected by the objective lens 6 to form a magnified transmission image 8a of the specimen 8. The magnified transmission image 8a is focused by the projector lens 7 as an image 8b on an image formation plane 9.

The apparatus for recording and reproducing electron microscope images, which is generally denoted at 10, is disposed below the lens barrel 1a. The apparatus 10 comprises a two-dimensional image sensor 11 such as a stimulable phosphor sheet, a stimulating means composed of a stimulating light source 12 and an optical scanning system 13 for scanning the stimulable phosphor sheet 11, a photoelectric transducer 15 such as a photomultiplier positioned in confronting relation to the stimulable phosphor sheet 11 through a light-transmissive window 14 in a peripheral wall of the lens barrel 1a, and an erasing light source 16.

The stimulable phosphor sheet 11 comprises a stimulable phosphor layer deposited on a transparent support. The stimulating light source 12 comprises an He - Ne laser or a semiconductor laser for emitting a stimulating laser beam 12a. The optical scanning system 13 includes a first light deflector 13a, a second light deflector 13b, and a fixed mirror 13c. Each of the first and second light deflectors 13a, 13b may be a known light deflector such as a galvanometer mirror, a polygonal mirror, a hologram scanner, or an acoustooptic deflector. The stimulating laser beam 12a emitted from the stimulating light source 12 is deflected by the first light deflector 13a in a first direction, and then deflected by the second light deflector 13b in a direction normal to the first direction as indicated by the arrow A. The deflected light beam 12a is passed through a sheet of lead glass fitted in a light-transmissive wall member 21 defined in the wall of the lens barrel 1a, and then deflected by the fixed mirror 13c to impinge upon the stimulable phosphor sheet 11. The stimulable phosphor sheet 11 is therefore two-dimensionally scanned in X and Y directions by the laser beam 12. The laser beam 12a is preferably passed through a filter (not shown) for cutting off the wavelength region of light emitted from the stimulable phosphor sheet 11, then adjusted in beam diameter by a beam expander (not shown) before being deflected by the light deflectors 13a, 13b, and finally passed through an $f\theta$ lens 13d into a uniform beam diameter prior to application to the stimulable phosphor sheet 11. The $f\theta$ lens 13d may comprise an ordinary two-dimensional $f\theta$ lens.

The erasing light source 16 emits light 16a in the same wavelength region as that of stimulating light to be applied to the stimulable phosphor sheet 11. A mirror 17 is positioned for angular movement between a first position in the path of the laser beam 12a between the second light deflector 13b and the fixed mirror 13c and a second position out of the path of the laser beam 12a. When the mirror 17 is in the first position, erasing light 19a emitted from the erasing light source 16 is gathered by a lens 18 and reflected by the mirrors 17, 13c to fall on the stimulable phosphor sheet 11 over its entire surface.

A shutter 19 for shutting off the electron beam 2 is angularly movably positioned between the stimulable phosphor sheet 11 and the lens barrel 1a. A sheet 20 of glass fitted in the window 14 has an optical filter for allowing light emitted from the stimulable phosphor sheet 11 to pass therethrough while cutting off the stimulating light beam 12a. A light shutter 24 is disposed between the glass sheet 20 and the photomultiplier 15. The interior of the lens barrel 1a including the portion accommodating the stimulable phosphor sheet 11 is kept under vacuum by a vacuum pump (not shown).

Operation of the apparatus 10 for recording and reproducing an electron microscope image will be described below. When the shutter 19 is opened as illustrated, the stimulable phosphor sheet 11 disposed in the image formation plane 9 is exposed to the electron beam 2 to store the energy of the electron beam 2 which carries the magnified transmission image 8b of the specimen 8. The light shutter 24 should preferably be closed while the stimulable phosphor sheet 11 is being exposed to the electron beam 2. Then, the shutter 19 is closed and the light shutter 24 is opened. The stimulating light source 12 is energized to emit the stimulating light beam 12a which is deflected in the X and Y directions to scan the stimulable phosphor sheet 11 two-dimensionally. The stimulable phosphor sheet 11 now emits light in an intensity commensurate with the energy level of the electron beam 2 which was applied to the sheet 11. The light thus emitted from the sheet 11 is photoelectrically detected by the photomultiplier 15 through the glass sheet 20, while at the same time the optical filter therein removes the stimulating light beam 12a.

In response to detection of the light emitted from the stimulable phosphor sheet 11, the photomultiplier 15 generates an electric signal which is processed by an image signal processor 22, and the processed signal is fed to an image reproducer 23 such as a CRT display or an image recording apparatus which optically scans a photosensitive film to record the image thereon. Therefore, the magnified transmission image 8b borne by the stimulated emission from the stimulable phosphor sheet 11 can be reproduced by employing the electric signal commensurate with the amount of the light emitted from the stimulable phosphor sheet 11.

Figure 3:
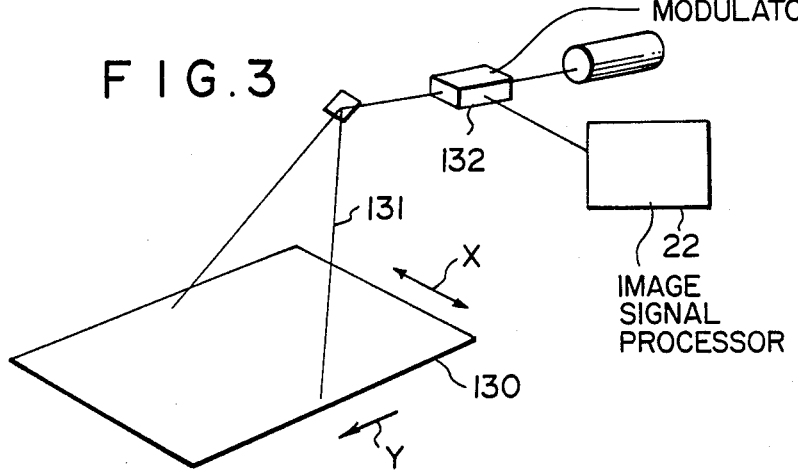
FIG. 3 is a perspective view of an image reproducer for reproducing an electron microscope image recorded by the apparatus of the invention.

FIG. 3 shows an image scanning recorder which can be used as the image reproducer 23. A photosensitive film 130 is scanned transversely in the direction of the arrow X (main scanning) by a laser beam 131 while at the same time the photosensitive film 130 is moved in the direction of the arrow Y (subscanning). At this time, the laser beam 131 is modulated by an acoustooptic modulator 132 based on the image signal supplied from the image processor 22 for thereby forming a visible image on the photosensitive film 130.

The size of the visible image reproduced on the photosensitive film 130 is selected to be larger than the size of the image formation plane 9 (i.e., the area in which the radiation image energy is recorded on the sheet 11). Therefore, the magnified transmission image 8b is reproduced on the photosensitive film 130 at a scale greater than that on the image formation plane 9. The image reproduced at the enlarged scale on the photosensitive film 130 is of sufficiently good quality since the magnified transmission image 8b can be defined highly sharply by using the stimulable phosphor sheet 11. As a consequence, the stimulable phosphor sheet 11 may be of a relatively small size, and the photomultiplier 15 may also be small in size, with the result that the overall apparatus may be small in size.

For producing a magnified image from the image scanning recorder shown in FIG. 3, the density of scanning lines employed in the image scanning recorder should be coarser than the density of scanning lines used in reading image information from the stimulable phosphor sheet 11. More specifically, it is preferable to set the scanning line density to 10 pixels/mm or more, particularly within the range from 15 pixels/mm to 100 pixels/mm, for reading sufficient image information from the stimulable phosphor sheet 11 of a relatively small size. For reproducing a magnified image without degrading its quality, the scanning line density for recording the image is selected to be coarser than the above scanning line density and preferably in the range from 5 pixels/mm to 20 pixels/mm.

While the optical filter in the glass sheet 20, the light shutter 24, and the photomultiplier 15 are shown as being disposed outside of the vacuum system in the lens barrel 1a, being arranged in named order away from the scanned side of the stimulable phosphor sheet 11, they may be disposed in the vacuum system in close contact with the stimulable phosphor sheet 11.

After the image has been read from the stimulable phosphor sheet 11, the light shutter 24 is closed and the mirror 17 is swung upwardly into the first position in the optical path of the light beam 12a. The erasing light source 16 is then energized to apply the erasing light 16a to the surface of the stimulable phosphor sheet 11 via the mirrors 17, 13c. Any residual image which may be left on the sheet 11 due to electron beam energy remaining thereon after exposure of the sheet 11 to the stimulating light beam 12a, can be removed from the stimulable phosphor sheet 11 by exposure to the erasing light, which can then be recycled. Upon exposure to the erasing light 16a, noise arising from a radioactive element such as $^{226}$Ra contained as an impurity in the phosphor of the sheet 11 can also be discharged. The erasing light source 16 may comprise a tungsten lamp, a halogen lamp, an infrared lamp, a xenon flash lamp, or a laser beam source, as disclosed in U.S. Pat. No. 4,400,619. The stimulating light source 12 may double as a light source for emitting the erasing light 16a.

When recording the magnified transmission image 8b on the stimulable phosphor sheet 11, it is necessary to focus the magnified transmission image 8b properly on the stimulable phosphor sheet 11. The focusing process may be performed, as with conventional electron microscopes, by displaying the magnified transmission image 8b on a phosphor screen positioned near the shutter 19 and allowing the operator to turn a focusing knob (not shown) of the electron microscope while observing the displayed image through an observing window in the wall of the lens barrel 1a. Alternatively, the magnified transmission image recorded on the stimulable phosphor sheet 11 may be reproduced as a focus-checking image on the image reproducer 23, and the operator may turn the focusing knob while observing the reproduced image for its focused condition. After the desired focused condition has been achieved, such a focus-checking image should be erased by the erasing light 16a, and a properly focused magnified transmission image should be recorded again on the stimulable phosphor sheet 11 and read again therefrom as a final output image for the purpose of observing the specimen 8. Where the focus-checking image is employed for focusing purposes, it is not necessary for the focus-checking image to be in the same size as that of the final output image. The focus-checking image may be obtained as a partial image by applying the stimulating light beam to a portion of the frame of the final output image and detecting light emitted from such a portion of the image frame. In this manner, the time required to reproduce the focus-checking image can be shortened, and hence the focusing efficiency can be increased. The focusing efficiency may also be improved by reading a focus-checking image as larger pixels than those required for reproducing a final output image.

The focus-checking image may be employed not only for focusing the magnified transmission image 8b, but also for determining the field of the final output image.

A shutter may be disposed in the lens barrel 1a between the specimen 8 and the electron gun 3 for cutting off the electron beam 2 when the sheet 10 is not exposed to the electron beam 2, so that the specimen 8 will be less subject to damage due to bombardment by the electron beam 2.

Figure 2:
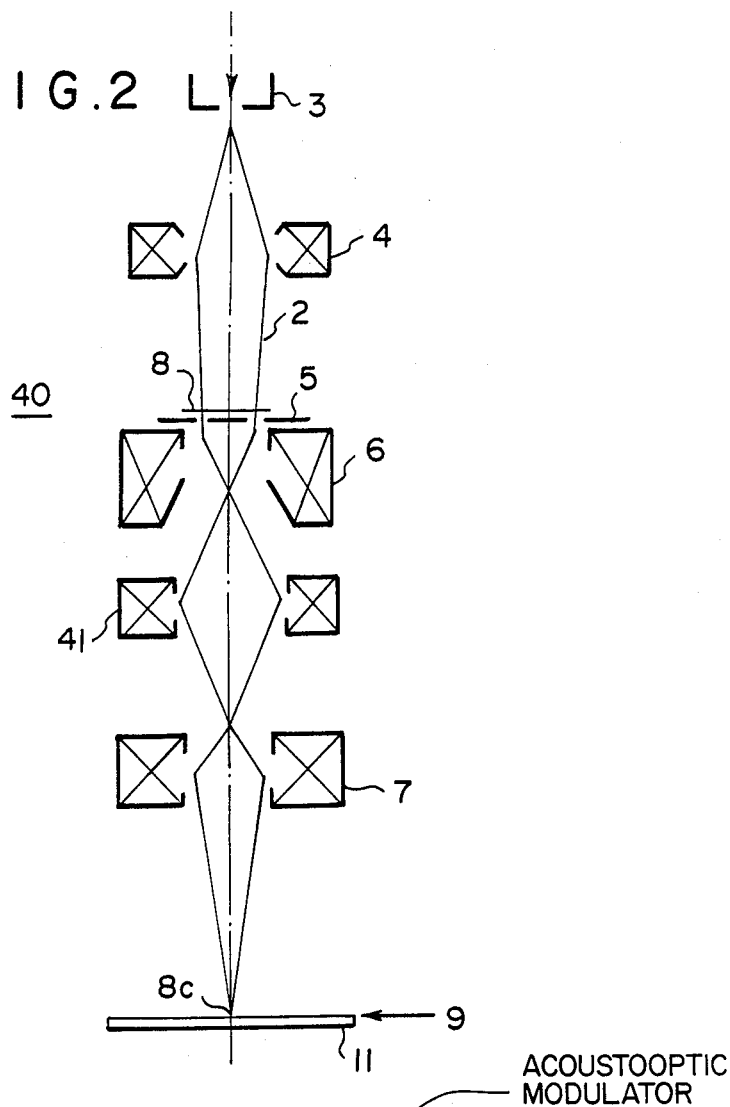
FIG. 2 is a schematic view of an electron microscope of another embodiment which can be employed in the apparatus of the present invention.

The principles of the present invention can be employed for recording and reproducing the diffraction pattern of a specimen. FIG. 2 is explanatory view of another electron microscope used for recording and reproducing such a diffraction pattern 8c of the specimen 8. The electron microscope, generally denoted at 40, has an intermediate lens 41 disposed between the objective lens 6 and the projector lens 7. The diffraction pattern 8c of the specimen 8, which is formed on the rear focal plane of the objective lens 7, is magnified by the intermediate lens 41 and the projector lens 7 with their focal points on the rear focal plane of the objective lens 7 and is projected onto the image formation plane 9. By placing the stimulable phosphor sheet 11 in the image formation plane 9, the magnified image of the diffraction pattern 8c can be recorded by the electron beam 2 on the stimulable phosphor sheet 11. The recorded diffraction pattern 8c can be read in the same manner as described with reference to FIG. 1, and the read image can be displayed on the CRT or printed as a hard copy.

The recorded pattern or recorded information is determined by the recorded condition of a transmitted electron-beam image (magnified transmission image or magnified diffraction pattern) recorded on the stimulable phosphor sheet 11, the nature of the specimen 8, and the manner of recording the image. For eliminating any adverse effect arising from varied recording conditions or for obtaining an electron microscope image which can clearly be observed, such recorded information should be obtained prior to the reproduction of a visible image by which the specimen can be observed. The read-out gain of the photomultiplier 15 should be adjusted or the image-dependent signal should be processed on the basis of the obtained recorded information. Furthermore, the generation of a reproduced image which can effectively be observed requires that a recording scale factor be determined in order to optimize the resolution of the reproduced image dependent on the contrast of the recorded pattern.

One way of obtaining the recorded information on the stimulable phosphor sheet 11 before a visible image is produced for observing the specimen 8 is disclosed in Japanese Unexamined Patent Publication No. 58(1983)-89245. More specifically, prior to the generation of a visible image for observing the specimen 8 (main reading mode), the recorded information stored in the stimulable phosphor sheet 11 is read (preliminary reading mode) with stimulating light having a lower level of energy than that of stimulating light to be applied in the main reading mode. Based on the recorded information thus obtained, the read-out gain is suitably adjusted or a recording scale factor is determined for the main reading mode, or the signal generated in the main reading mode is appropriately processed.

Alternatively, the image produced for focusing purpose may be reproduced on the display such as a CRT, and the operator may determine a suitable read-out gain, a recording scale factor, or signal processing conditions while observing the focusing image displayed on the display. Then, the final image may be read out according to the determined read-out gain or the scale factor, or the image signal may be processed under the determined processing conditions.

The stimulable phosphor sheet may comprise a thermofluorescent phosphor sheet. For discharging the stored energy from the thermofluorescent phosphor sheet, the sheet may be scanned by thermal radiation emitted from a heat source such as a $CO_2$ laser source. For more details, reference made to Japanese Patent Publication No. 55(1980)-47720.

Figure 4:
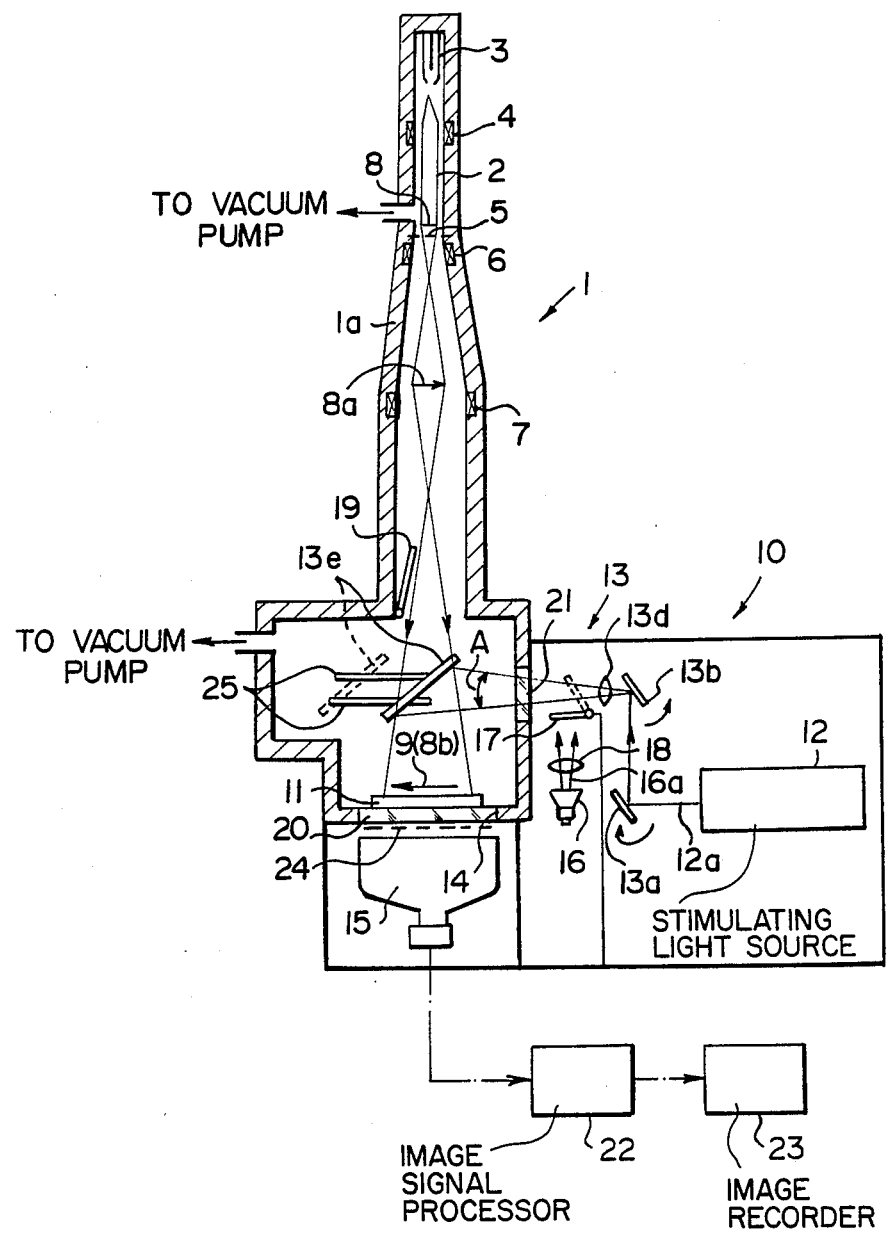
FIGS. 4 through 9 are vertical cross-sectional views of apparatus for recording and reproducing images produced by an electron microscope according to other embodiments of the present invention.

FIG. 4 illustrates an apparatus for recording and reproducing electron microscope images according to another embodiment of the present invention. The apparatus shown in FIG. 4 differs from the apparatus of FIG. 1 in that the optical scanning system 13 includes, in place of the mirror 13c, an mirror 13e movably disposed in the lens barrel 1a of the electron microscope 1.

The mirror 13e is movable, manually or by a suitable actuator, along a pair of guide bars 25 between an operating position in which it substantially faces the center of the stimulable phosphor sheet 11 or is located in the path of the electron beam 2, and a retracted position (shown by the dotted lines) in which it is retracted out of the path of the electron beam 2 to allow the stimulable phosphor sheet 11 to be exposed to the electron beam 2.

For exposing the stimulable phosphor sheet 11 to the electron beam 2, the mirror 13e is moved to the retracted position to allow the electron beam 2 to impinge upon the stimulable phosphor sheet 11. The electron beam 2 bearing the magnified transmission image 8b of the specimen 8 is applied to the stimulable phosphor sheet 11, which now stores the energy of the applied electron beam 2. When the stored electron beam energy is to be read out, the mirror 13e is displaced to the operating position, and the stimulating laser beam 12a emitted from the stimulating light source 12 is deflected by the first and second light deflectors 13a, 13b, passes through the $f\theta$ lens 13d, and then is directed by the mirror 13e to fall on the stimulable phosphor sheet 11 to scan the same two-dimensionally, i.e. the X and Y directions. Since the stimulating laser beam 12a is directed toward the stimulable phosphor sheet 11 by the mirror 13e located in a position which is substantially opposite the center of the stimulable phosphor sheet 11, the diameter of the scanning spot of the laser beam 12a on the stimulable phosphor sheet 11 and the length of the laser beam 12a do not vary widely between the center and ends of the sheet 11. Therefore, the diameter of the stimulating laser beam spot can be made sufficiently uniform by the $f\theta$ lens 13d, with the result that the electron microscope image recorded on the stimulable phosphor sheet 11 can be read out highly accurately by the scanning beam spot. Accordingly, the image information stored in the stimulable phosphor sheet 11 can be read out highly accurately to reproduce the magnified transmission image 8b properly without image distortion.

The mirror 13e remains located in the operating position while the erasing light 16a is applied to the stimulable phosphor sheet 11 to discharge any remaining electron beam energy and noise therefrom. After the remaining electron energy and noise have been eliminated from the stimulable phosphor sheet 11, the mirror 13e is moved back to the retracted position to make the stimulable phosphor sheet 11 ready for another cycle of image recording and reproducing operation.

Figure 5:
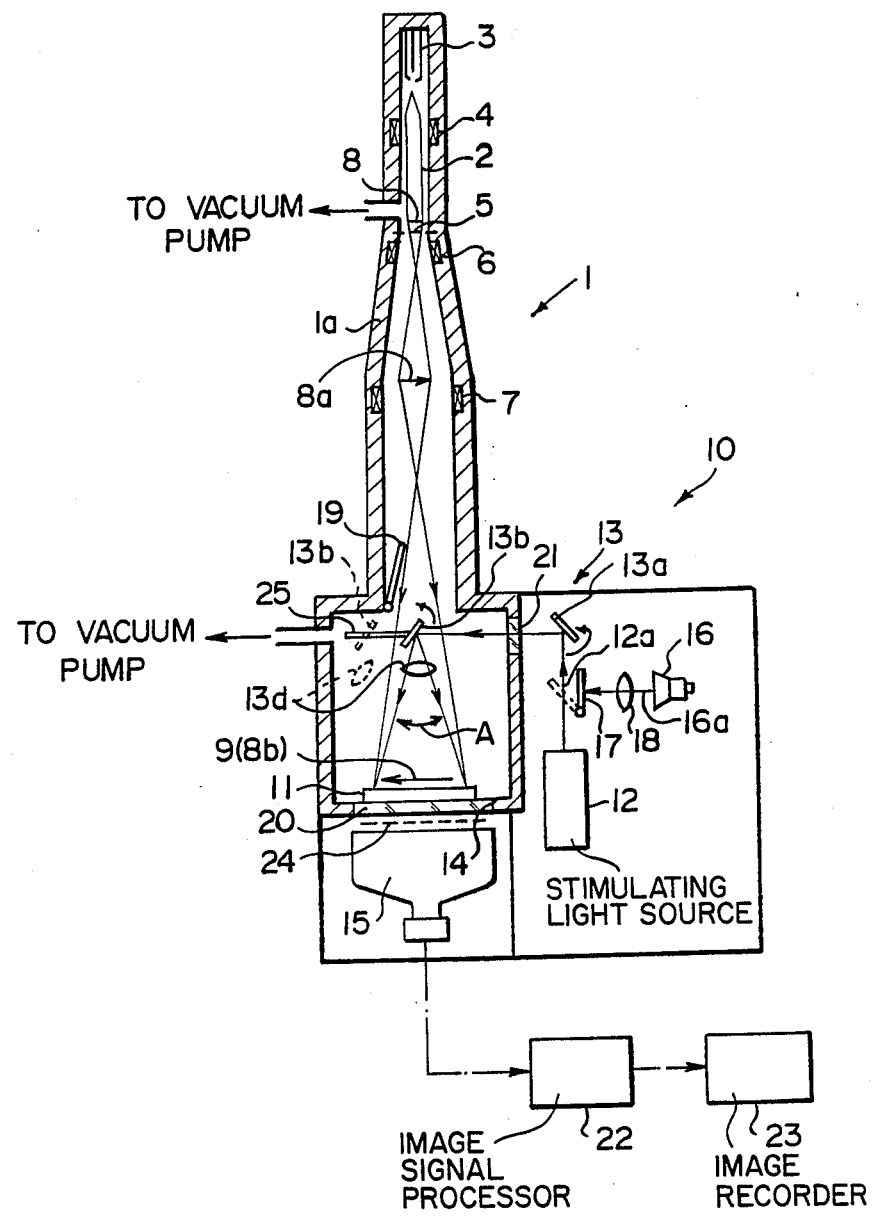

According to still another embodiment shown in FIG. 5, the second light deflector 13b and the $f\theta$ lens 13d of the optical scanning system 13 are disposed in the lens barrel 1a and are made movable along a guide bar 25 between the operating and retracted positions. When the second light deflector 13b and the $f\theta$ lens 13d are located in the operating position, the stimulating laser beam 12a from the stimulating laser source 12 is directed by the first and second light deflectors 13a, 13b and the $f\theta$ lens 13d to scan the stimulable phosphor sheet 11 two-dimensionally. The scanning beam spot remains substantially uniform over the stimulable phosphor sheet 11, assuring accurate read-out of the image information on the stimulable phosphor sheet 11. The erasing light 16a emitted from the erase light source 16 can also be directed by the first and second light deflectors 13a, 13b to scan the stimulable phosphor sheet 11.

Figure 6:
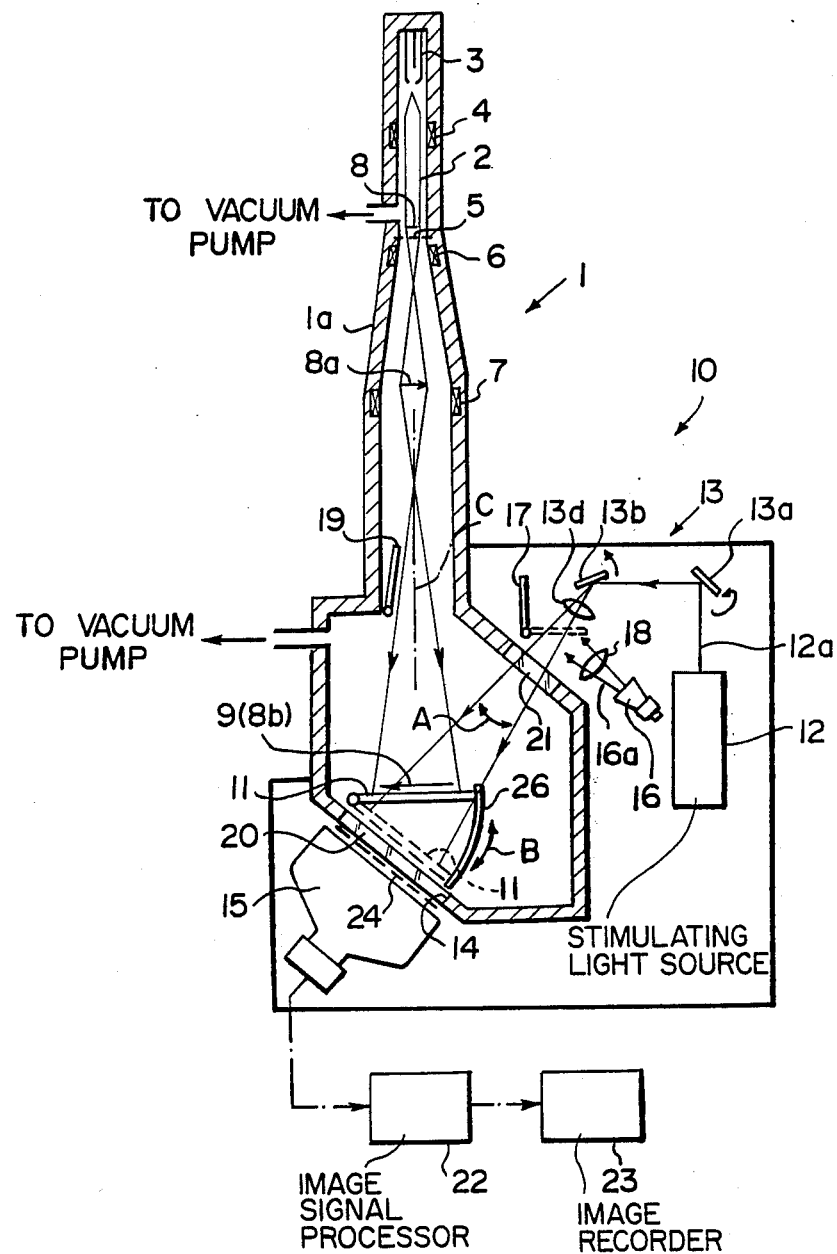

FIG. 6 illustrates an apparatus according to a still further embodiment of the present invention. In the apparatus of FIG. 6, the stimulable phosphor sheet 11 is angularly movable, manually or by an actuator, along an arcuate guide bar 26 in the direction of the arrow B between a recording position, indicated by solid lines, in which the stimulable phosphor sheet 11 lies substantially perpendicularly to the axis C of the electron beam 2, and a read-out position, indicated by dotted lines, in which the stimulable phosphor sheet 11 lies obliquely to the axis C of the electron beam 2. When the stimulable phosphor sheet 11 is in the read-out position, the second light deflector 13b is substantially opposite the center of the stimulable phosphor sheet 11 and is positioned out of the path of the electron beam 2 so as not to interfere with the exposure of the stimulable phosphor sheet 11 to the electron beam 2.

When the stimulable phosphor sheet 11 is to be exposed to the electron beam 2, it is held in the recording position. After the energy of the electron beam 2 is stored in the stimulable phosphor sheet 11, when it is to be read out, the stimulable phosphor sheet 11 is brought to the read-out position. Then, the stimulable phosphor sheet 11 is two-dimensionally scanned by the stimulating laser beam 12a emitted from the stimulating laser source 12 and directed by the first and second light deflectors 13a, 13b.

Figure 7:
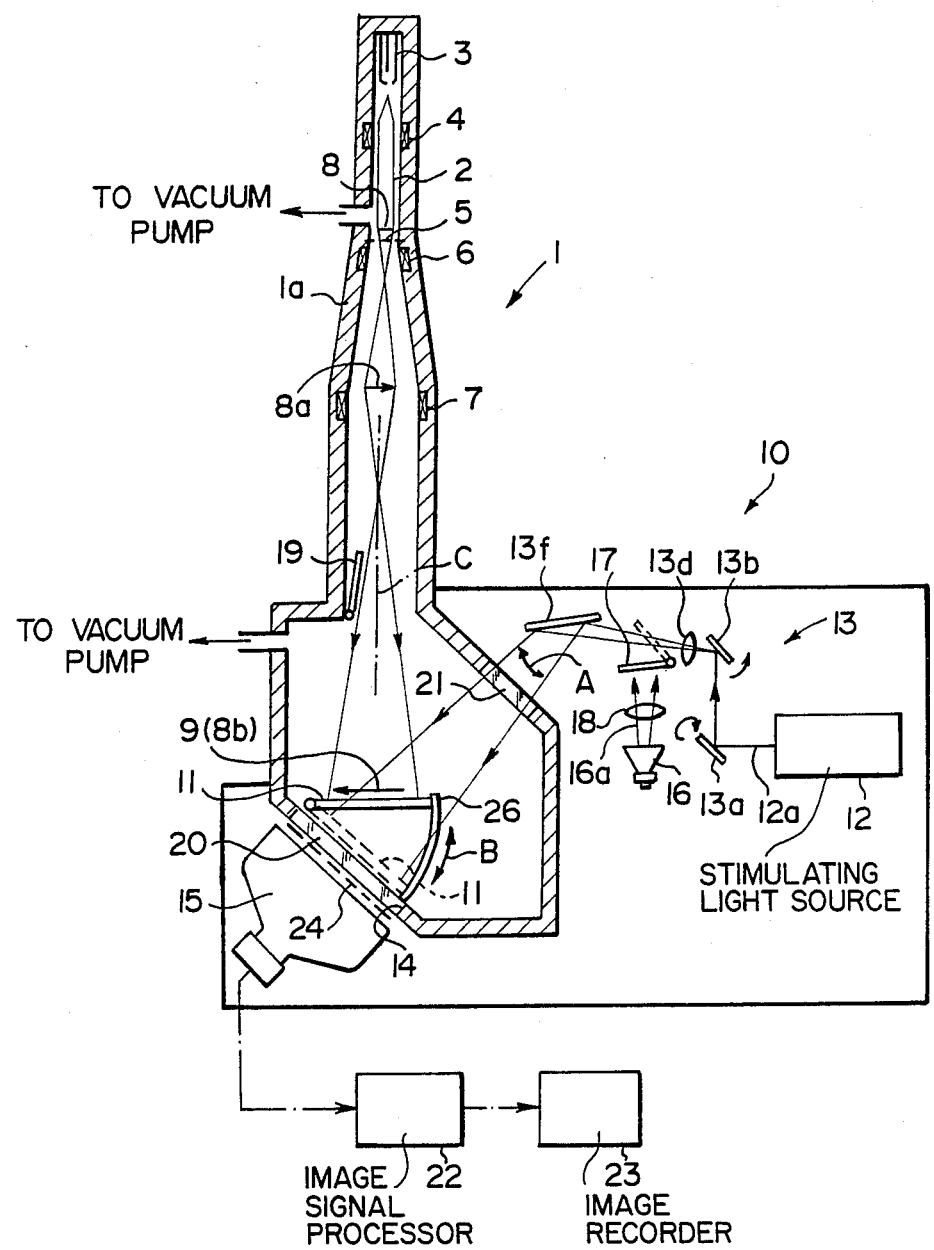

FIG. 7 shows an apparatus according to still another embodiment, in which a mirror 13f is fixed in substantially opposing relation to the center of the stimulable phosphor sheet 11 in the read-out position. For reading out the electron beam energy from the stimulable phosphor sheet 11, the stimulating laser beam 12a is applied via the first and second light deflectors 13a, 13b and the fixed mirror 13f to the stimulable phosphor sheet 11 for two-dimensionally scanning the same.

Figure 8:
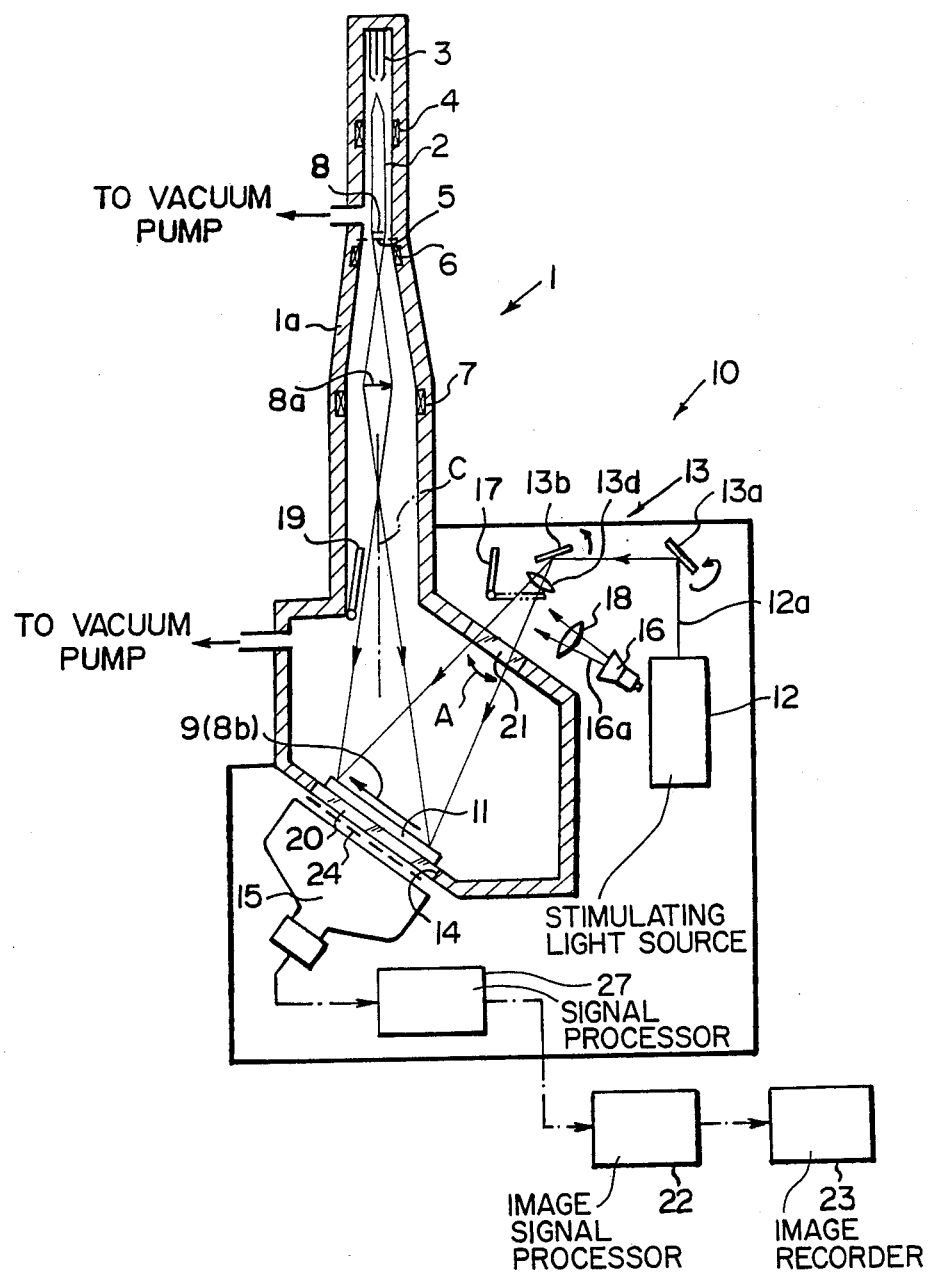

FIG. 8 is a planetary view of a still further embodiment in which the stimulable phosphor sheet 11 is fixedly positioned obliquely to the axis C of the electron beam 2, and the second light deflector 13b is substantially opposite the center of the stimulable phosphor sheet 11 which is fixed in position. The magnified transmission image 8b recorded on the stimulable phosphor sheet 11 thus inclined to the axis C is distorted, i.e., the image 8b is elongated in the direction in which the sheet 11 is inclined, and is more magnified toward the edge of the sheet 11 which the electron beam 2 travels a longer path before reaching. The output signal produced by the photomultiplier 15 when the stimulable phosphor sheet 11 is two-dimensionally scanned by the stimulating laser beam 12a is processed by a signal processor 27 to remove the image elongation and magnification resulting from the inclined disposition of the sheet 11 for thereby producing the magnified transmission image 8b on the image formation plane normal to the axis C of the electron beam 2.

Figure 9:
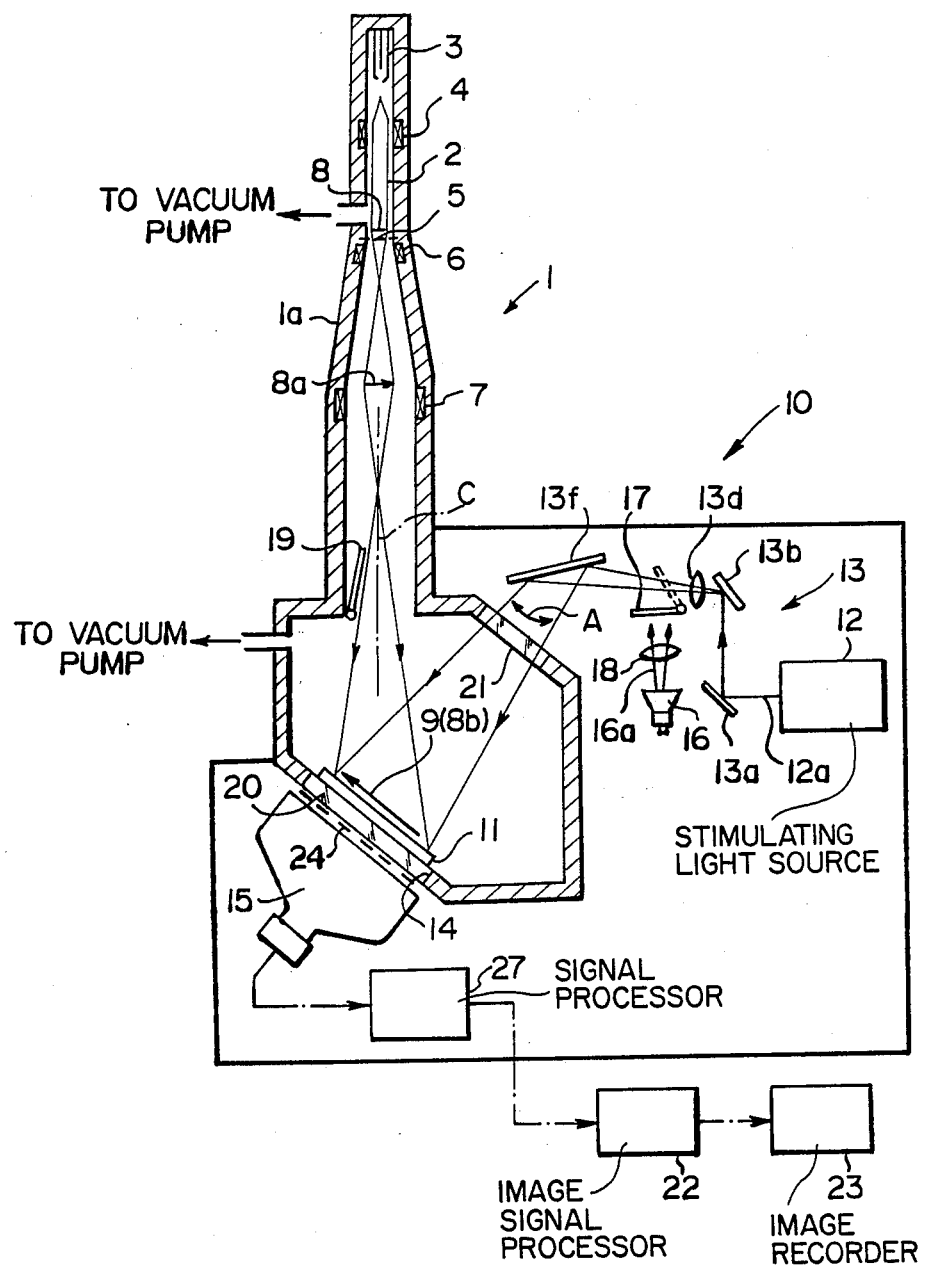

In still another embodiment shown in FIG. 9, a fixed mirror 13f is disposed in substantially opposing relation to the center of the stimulable phosphor sheet 11 fixed obliquely to the axis C of the electron beam 2 for directing the stimulating laser beam 12a deflected by the first and second light deflectors 13a, 13b toward the stimulable phosphor sheet 11.

Figure 10:
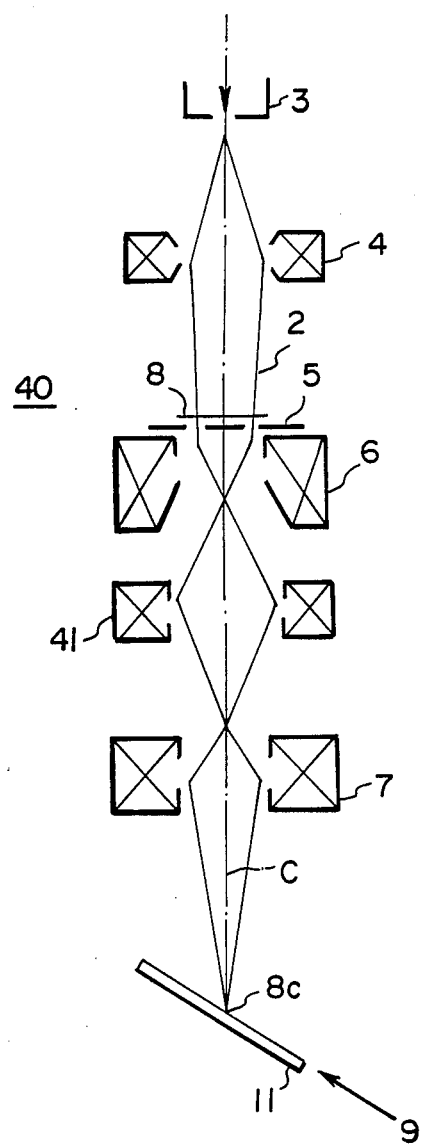
FIG. 10 is a schematic view of an electron microscope of still another embodiment which can be incorporated in the apparatus shown in FIGS. 8 and 9.

FIG. 10 shows another electron microscope employed for recording and reproducing the diffraction pattern of a specimen. The electron microscope of FIG. 10 is substantially the same as the electron microscope shown in FIG. 2 except that the stimulable phosphor sheet 11 is inclined with respect to the axis C of the electron beam 2. The magnified specimen diffraction pattern recorded on the inclined stimulable phosphor sheet 11 is distorted and can be corrected by processing the output signal from the photomultiplier 15 (FIGS. 8 and 9) with the signal processor 27.

Although certain preferred embodiments have been shown and described, it should be understood that many changes and modifications may be made therein without departing from the scope of the appended claims.

We claim:

1. An apparatus for recording and reproducing an image of a specimen produced by an electron microscope, comprising:
   (i) a two-dimensional image sensor for storing the energy of an electron beam having passed through the specimen;
   (ii) stimulating means for scanning said two-dimensional image sensor with stimulating energy to discharge the stored electron beam energy as light from the two-dimensional image sensor;
   (iii) a photoelectric transducer for photoelectrically detecting the light discharged from said two-dimensional image sensor; and
   (iv) erasing means for applying erasing energy to said two-dimensional image sensor to discharge energy remaining thereon after the light has been photoelectrically detected;
   further comprising an optical filter for cutting off light having a wavelength in the wavelength region of the stimulating energy, and a light shutter openable when the light discharged from said two-dimensional image sensor is photoelectrically detected by said photoelectric transducer and closable when the remaining energy is discharged from said two-dimensional image sensor by said erase means, said optical filter and said light shutter being interposed between said two-dimensional image sensor and said photoelectric transducer remotely from the side of said two-dimensional image sensor which is scanned with said stimulating energy.

2. An apparatus for recording and reproducing an image of a specimen produced by an electron microscope, comprising:
   (i) a two-dimensional image sensor for storing the energy of an electron beam having passed through the specimen;
   (ii) stimulating means for scanning said two-dimensional image sensor with stimulating energy to discharge the stored electron beam energy as light from the two-dimensional image sensor;
   (iii) a photoelectric transducer for photoelectrically detecting the light discharged from said tow-dimensional image sensor; and
   (iv) erasing means for applying erasing energy to said two-dimensional image sensor to discharge energy remaining thereon after the light has been photoelectrically detected;
   wherein said stimulating means comprises a deflecting element for deflecting the stimulating energy toward said two-dimensional image sensor; and
   wherein said deflecting element is fixed.

3. An apparatus for recording and reproducing an image of a specimen produced by an electron microscope, comprising:
   (i) a two-dimensional image sensor for storing the energy of an electron beam having passed through the specimen;
   (ii) stimulating means for scanning said two-dimensional image sensor with stimulating energy to discharge the stored electron beam energy as light from the two-dimensional image sensor;

(iii) a photoelectric transducer for photoelectrically detecting the light discharged from said two-dimensional image sensor; and (iv) erasing means for applying erasing energy to said two-dimensional image sensor to discharge energy remaining thereon after the light has been photoelectrically detected;

wherein said stimulating means comprises a deflecting element for deflecting the stimulating energy toward said two-dimensional image sensor; and wherein said deflecting element is movable between a first position in which the deflecting element is substantially opposite the center of said two-dimensional image sensor and directs the stimulating energy toward said two-dimensional image sensor and a second position in which the deflecting element is retracted out of the path of the electron beam toward said two-dimensional image sensor.

4. An apparatus for recording and reproducing an image of a specimen produced by an electron microscope, comprising:

(i) a two-dimensional image sensor for storing the energy of an electron beam having passed through the specimen;

(ii) stimulating means for scanning said two-dimensional image sensor with stimulating energy to discharge the stored electron beam energy as light from the two-dimensional image sensor;

(iii) a photoelectric transducer for photoelectrically detecting the light discharged from said two-dimensional image sensor; and (iv) erasing means for applying erasing energy to said two-dimensional image sensor to discharge energy remaining thereon after the light has been photoelectrically detected;

wherein said two-dimensional image sensor is movable between a recording position in which the two-dimensional image sensor lies substantially perpendicularly to the axis of the electron beam and a read-out position in which the twodimensional image sensor lies obliquely to the axis of the electron beam, said stimulating means including a deflecting element for deflecting the stimulating energy toward said two-dimensional image sensor, said deflecting element being positioned to be substantially opposite the center of said two-dimensional image sensor in said read-out position and out of the path of said electron beam.

5. An apparatus for recording and reproducing an image of a specimen produced by an electron microscope, comprising:

(i) a two-dimensional image sensor for storing the energy of an electron beam having passed through the specimen;

(ii) stimulating means for scanning said two-dimensional image sensor with stimulating energy to discharge the stored electron beam energy as light from the two-dimensional image sensor;

(iv) a photoelectric transducer for photoelectrically detecting the light discharge from said two-dimensional image sensor; and (v) erasing means for applying erasing energy to said two-dimensional image sensor to discharge energy remaining thereon after the light has been photoelectrically detected;

wherein said two-dimensional image sensor is fixed obliquely to the axis of the electron beam, said stimulating means including a deflecting element for deflecting the stimulating energy toward said two-dimensional image sensor, said deflecting element being positioned to be substantially opposite the center of said two-dimensional image sensor and out of the path of said electron beam, further including a signal processor for converting an output signal from said photoelectric transducer indicative of the electron microscope image on said two-dimensional image sensor lying obliquely to the axis of the electron beam into a signal representing an electron microscope image on the image formation plane of the electron microscope which lies perpendicularly to the axis of the electron beam.

* * * * *